United States Patent [19]
Esterberg et al.

[11] Patent Number: 5,825,625
[45] Date of Patent: Oct. 20, 1998

[54] HEAT CONDUCTIVE SUBSTRATE MOUNTED IN PC BOARD FOR TRANSFERRING HEAT FROM IC TO HEAT SINK

[75] Inventors: Dennis R. Esterberg, Philomath; Mark A. Smith, Corvallis; Paul A. Rubens, Salem; Tracy A. Lang, Corvallis, all of Oreg.

[73] Assignee: Hewlett-Packard Company, Palo Alto, Calif.

[21] Appl. No.: 728,394

[22] Filed: Oct. 9, 1996

Related U.S. Application Data

[63] Continuation-in-part of Ser. No. 650,407, May 20, 1996, abandoned.

[51] Int. Cl.⁶ .................................................. H05K 7/20
[52] U.S. Cl. ......................... 361/719; 257/717; 257/720; 361/705
[58] Field of Search .................... 165/80.3, 185; 174/16.3, 252; 257/706, 707, 709, 711–713, 717, 720, 726, 727; 361/704–712, 717–719, 722, 761, 764, 789, 792, 795

[56] References Cited

U.S. PATENT DOCUMENTS

| | | |
|---|---|---|
| 4,420,767 | 12/1983 | Hodge ........................................ 357/81 |
| 4,602,314 | 7/1986 | Broadbent . |
| 4,649,460 | 3/1987 | Marchisi et al. . |
| 4,731,693 | 3/1988 | Berg ......................................... 361/386 |
| 4,750,089 | 6/1988 | Derryberry et al. . |
| 4,849,856 | 7/1989 | Funari et al. ............................. 361/386 |
| 5,095,404 | 3/1992 | Chao ........................................ 361/385 |
| 5,229,918 | 7/1993 | Della Bosca et al. . |
| 5,263,245 | 11/1993 | Patel .......................................... 29/840 |
| 5,278,724 | 1/1994 | Angulas et al. ......................... 361/707 |
| 5,291,372 | 3/1994 | Matsumoto . |
| 5,375,039 | 12/1994 | Wiesa . |
| 5,410,451 | 4/1995 | Hawthrone et al. ..................... 437/208 |
| 5,578,869 | 11/1996 | Hoffman et al. ........................ 257/691 |
| 5,617,294 | 4/1997 | Watson .................................... 361/719 |
| 5,646,931 | 7/1997 | Manteghi ................................. 361/813 |

FOREIGN PATENT DOCUMENTS

| | | | |
|---|---|---|---|
| 0 103 068 A2 | 3/1984 | European Pat. Off. ................ 257/675 |
| 1-248543 | 10/1989 | Japan ..................................... 257/675 |
| 2-79451 | 3/1990 | Japan ..................................... 437/902 |
| 4-48740 | 2/1992 | Japan ..................................... 437/902 |

*Primary Examiner*—Gerald P. Tolin

[57] ABSTRACT

A heat conductive substrate is mounted within a through-opening of a printed circuit board. An integrated circuit then is mounted to one side of the heat conductive substrate, while a heat sink is fixed in thermal contact to the other side of the substrate. There is no direct thermal contact between the IC and the PC board. The substrate is mounted to an undersurface of the PC board and concentrically spaced from the PC board within the opening. An air gap occurs between the substrate and the PC board within the opening to substantially reduce heat conductivity into the PC board.

7 Claims, 4 Drawing Sheets

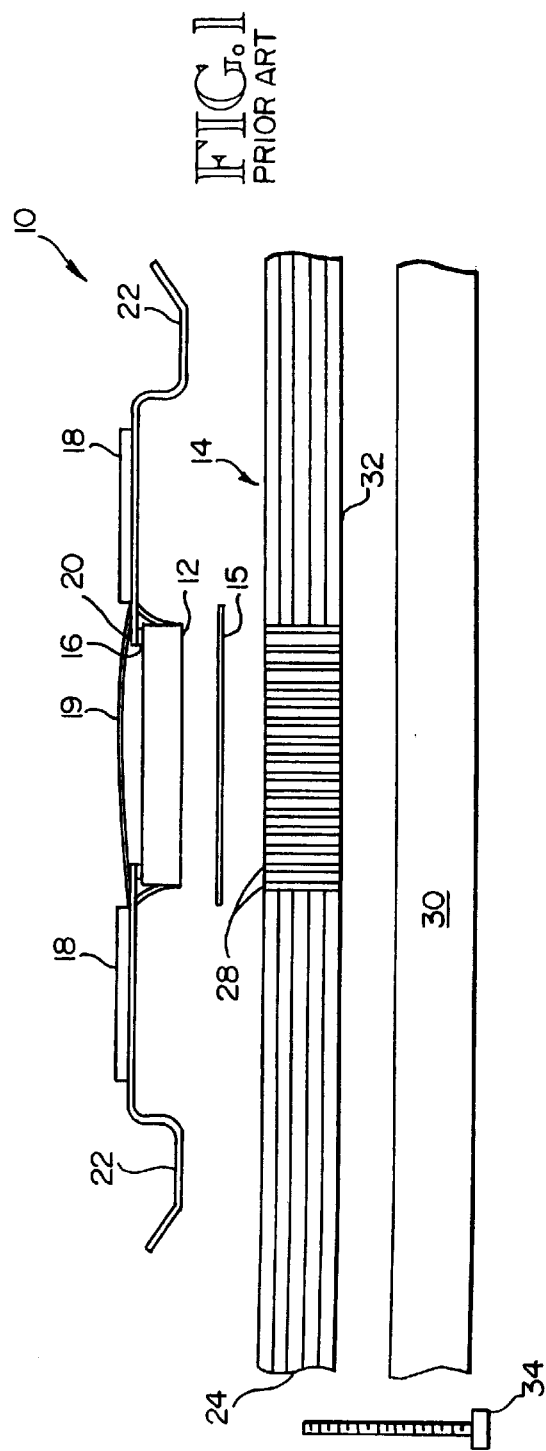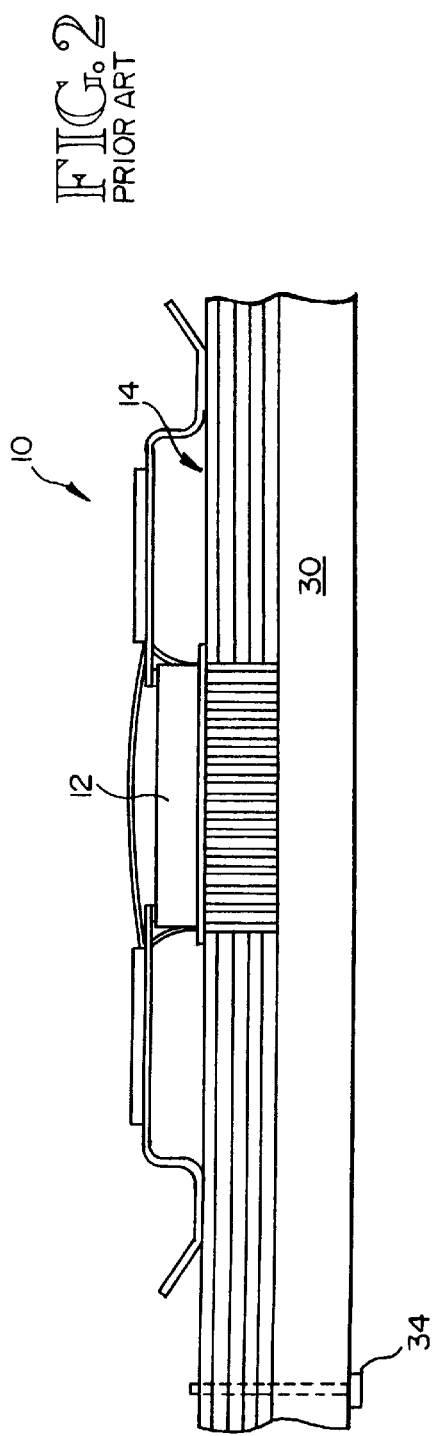

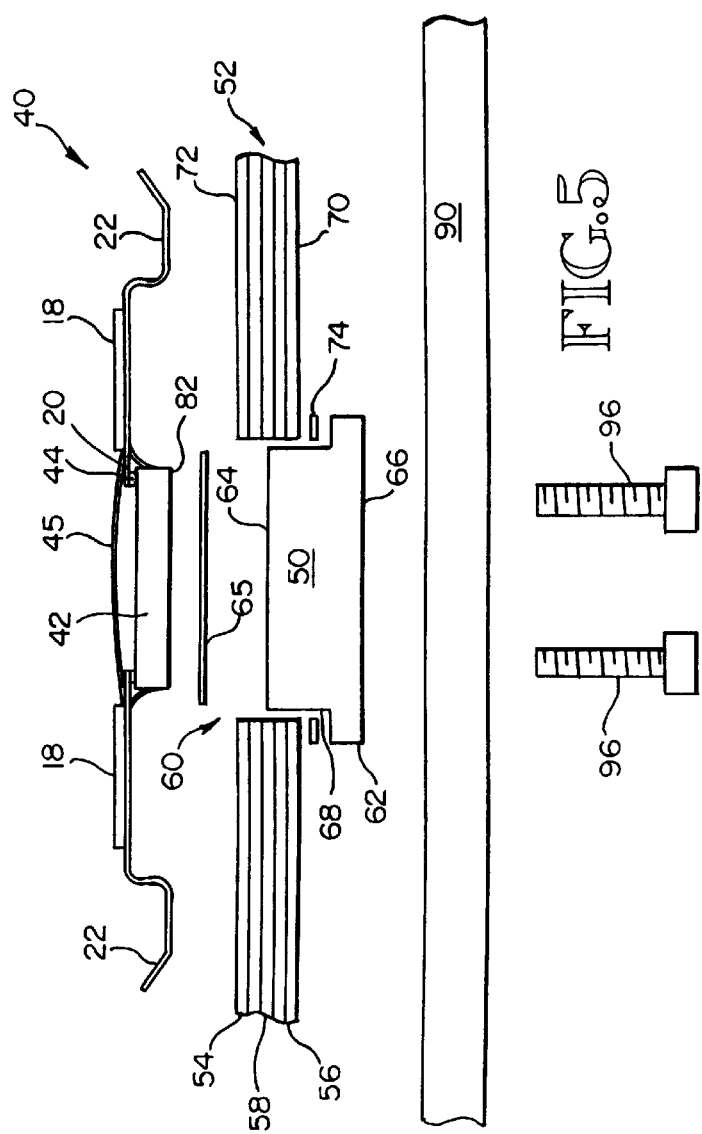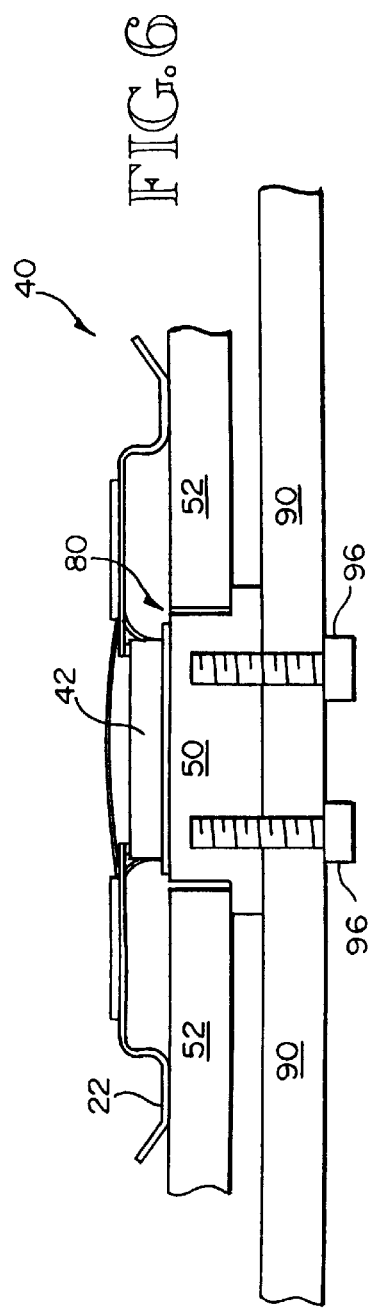

HEAT CONDUCTIVE SUBSTRATE MOUNTED IN PC BOARD FOR TRANSFERRING HEAT FROM IC TO HEAT SINK

CROSS REFERENCE TO RELATED APPLICATIONS

This application is a Continuation-In-Part of commonly assigned U.S. patent application Ser. No. 08/650,407, filed May 20, 1996, now abandoned.

BACKGROUND OF THE INVENTION

This invention relates generally to methods and apparatus for dissipating heat from integrated circuit devices, and more particularly, to printed circuit board heat sinks and methods for transferring heat from integrated circuit devices to such heat sinks.

As integrated circuits ("ICs"), and in particular, microprocessors are designed to run at increasing speeds, such circuits consume more power and generate more heat. Such heat needs to be dissipated to maintain the integrated circuit and nearby circuits within rated operating temperature ranges. Conventionally, this is done by coupling the IC's to heat sinks and blowing air using cooling fans. In addition, some faster microprocessor chips, such as some Pentium™ microprocessor models, have increased maximum temperature tolerances to 95° C. Although such chips can withstand increased and relatively high operating temperatures, neighboring IC's can not. The neighboring chips are often limited to conventional maximum operating temperatures of approximately 70° C. With the microprocessor in close proximity to these less tolerant components, some of the microprocessor's heat tends to flow into the printed circuit ("PC") board and to such components. Of concern is the overheating of the surrounding components. To avoid damage to the less tolerant components in the vicinity of the heat generating microprocessor, it is known to throttle back the microprocessor's speed when peak operating temperatures are sensed. Reducing the speed causes the microprocessor to generate less heat. It also means, however, that the customer's product is not operating as fast as expected. Accordingly, there is an ongoing need for transferring heat away from the microprocessor without unduly heating neighboring components and without compromising processor speed.

A conventional heat transfer method uses copper-lined vias in a PC board to transfer heat from the microprocessor to a heat sink. Copper is a good conductor of heat. The microprocessor is mounted to the PC board providing a thermal contact between the microprocessor and the copper walls of the vias. A heat sink typically is mounted to the underside of the PC board. Heat from the microprocessor then is conducted along the copper walls away from the microprocessor to the heat sink. A shortcoming of such approach is that heat conducted along the copper walls of the vias travels, not only to the heat sink, but also into the several copper layers of the PC board. The PC board typically includes a plurality of copper layers for electrically interconnecting the multiple IC chips on the PC board. Such copper layers border the via at the copper lining. Thus, undesirably effective heat transfer paths also occur between the microprocessor and nearby devices.

Another shortcoming of conventional heat transfer solutions relates to the microprocessor surface mounting process. To enhance thermal conductivity between a microprocessor and the PC board vias, the region where the microprocessor is to be placed typically is covered with solder. During the surface mounting process, the solder becomes liquid. Then, when resolidifying, the solder defines a heat conductive bridge from microprocessor to PC board. Unfortunately the solder mounds up in areas resulting in a very uneven surface. The non-planar solder interface between microprocessor and PC board reduces the thermal transfer effectiveness of the bridge. Accordingly, there is need for a more effective chip mounting technique, and a more effective thermal contact.

SUMMARY OF THE INVENTION

According to the invention, a heat conductive substrate is mounted within a through-opening of a printed circuit ("PC") board. An integrated circuit then is mounted to one side of the heat conductive substrate, while a heat sink is in thermal contact to the other side. In particular the integrated circuit is not mounted into thermal contact with the PC board. With no direct thermal contact between the IC and the PC board one thermal transfer path between the IC and neighboring circuits is eliminated.

According to one aspect of the invention, the substrate is mounted to one outer layer of the PC board and concentrically spaced from other layers of the PC board. An air gap thus occurs between the heat conductive substrate and most layers of the PC board. This substantially reduces heat conductivity into the intermediary layers of the PC board. In a preferred embodiment the heat conductive substrate is mounted to an undersurface of the PC board—such undersurface being the closest PC board layer to the heat sink. In some embodiments the heat sink is in thermal contact with such undersurface in the vicinity of the substrate.

According to another aspect of the invention, an integrated circuit is mounted on one side of the substrate. In a preferred embodiment an adhesive is used for such mounting to provide a smooth co-planar contact. The co-planar contact provides a continuous, effective heat transfer bridge from IC to substrate. According to another aspect of the invention, a heat sink is in thermal contact to an underside of the substrate.

According to another aspect of the invention, an apparatus for conducting heat away from a first integrated circuit is mounted to a PC board. The PC board has a top surface, a bottom surface and an intermediary layer, and defines a through opening from the top surface through the bottom surface. The first integrated circuit has a first underlying surface area. The apparatus includes a heat conductive substrate positioned within the through-opening. The substrate has a first surface with an area at least as large as the first integrated circuit first underlying surface area. The first integrated circuit is mounted to the heat conductive substrate first surface. The substrate is concentrically spaced apart from the PC board intermediary layer. An air gap occurs between the substrate and the intermediary layer within the through opening. In a preferred embodiment the substrate is formed of copper. To provide a smooth co-planar thermal contact between the first integrated circuit and the heat conducting substrate, the first integrated circuit is adhesively mounted to the heat conductive substrate. A heat sink is mounted or otherwise fixed into thermal contact with the substrate. In some embodiments the substrate is an integral part of the heat sink.

According to another aspect of the invention, a heat transfer path between a first integrated circuit and a heat sink is formed in a method including the steps of mounting a heat conductive substrate within a through-opening of a PC board, and fixing the first integrated circuit into thermal contact with the substrate. The first integrated circuit is fixed to a first surface area of the substrate at an underlying surface of the first integrated circuit. The substrate first surface area is at least as large as the first integrated circuit first underlying surface area to avoid direct thermal contact between the first integrated circuit and the PC board. The substrate is maintained in thermal contact with the heat sink.

One advantage of the invention is that heat conductivity between a given integrated circuit, such as a high speed microprocessor, and neighboring circuits is reduced. Another advantage is that an effective heat transfer path is established between a given integrated circuit and a heat sink. Another advantage is that an effective thermal contact is established between a given integrated circuit package and the substrate. Another advantage is that an awkward thermal transfer path occurs between the heat transfer substrate and the PC board intermediary layers. These and other aspects and advantages of the invention will be better understood by reference to the following detailed description taken in conjunction with the accompanying drawings.

BRIEF DESCRIPTION OF THE DRAWINGS

FIG. 1 is an exploded cross-sectional view of a PC board, integrated circuit and heat sink configured to implement a conventional heat transfer method between the integrated circuit and heat sink;

FIG. 2 is a cross-sectional view of the PC board, integrated circuit and heat sink of FIG. 1;

FIG. 5 is an exploded partial view of a PC board, integrated circuit, heat conductive substrate and heat sink configured to implement heat transfer according to an embodiment of this invention; and FIG. 6 is a cross-sectional view of a PC board, integrated circuit, heat conductive substrate and heat sink of FIG. 5;

DESCRIPTION OF SPECIFIC EMBODIMENTS

Figure 3:
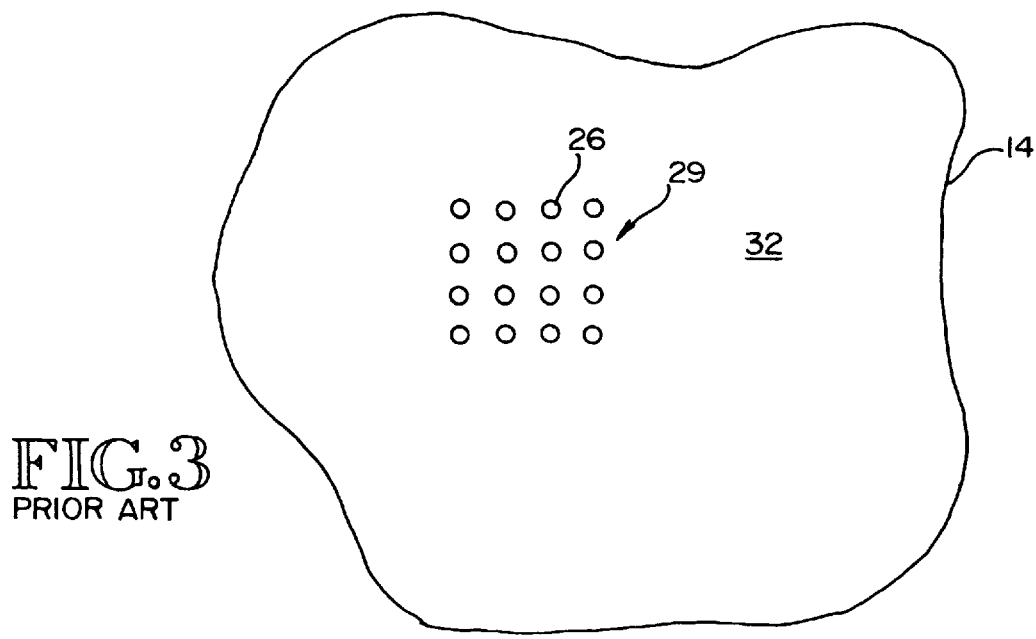
FIG. 3 is a partial view of an undersurface of the PC board of FIG. 1.

FIGS. 1 and 2 show a conventional heat dissipation structure 10 for transferring heat away from a high speed microprocessor integrated circuit 12. The microprocessor 12 is mounted to a multi-layer PC board 14, typically by thermal mounting tape 15, or by another surface mounting technique. The microprocessor includes contacts 16 for enabling electrical interfacing to other integrated circuits, devices and signal paths. Typically a polyamide structure 18 maps contact connections between the microprocessor 12 and PC board traces. The polyamide structure 18 includes inner leads 20 compression mounted to the microprocessor contacts 16 and outer leads 22 soldered to the PC board traces. The polyamide structure 18 has internal circuit paths which are mapped to provide desired path connections between a given inner lead 20 (and thus a desired microprocessor contact 16) and a given outer lead 22 (and thus a desired PC board trace). An encapsulant 19 typically is applied to the microprocessor 12 at a surface adjacent to the polyamide structure.

The PC board includes multiple layers 24 for defining PC signal path traces for interconnecting the microprocessor 12 and other integrated circuits mounted to the PC board 14. The PC board 14 includes multiple vias 26 in the area where the microprocessor is mounted (see FIG. 3). The vias 26 are shown at an exaggerated diameter for purposes of illustration. A typical vias has a diameter of approximately 14 mils (0.014 inches). Although an array 29 of only 4×4 vias 26 are shown, conventionally there are approximately 100 underlying a microprocessor undersurface that extends 0.5 inches on each side. The vias have copper lined walls 28 (see FIGS. 1 and 2) which serve as heat transfer conductors. A heat sink 30 is held to an undersurface 32 of the PC board 14 in the region of the vias 26. Typically, mounting screws 34 are used to hold the heat sink 30 to the PC board 14. Heat is conducted away from the microprocessor 12 along the copper walls 28 to the heat sink 30. Such copper walls 28, however, also are in intimate thermal contact with the PC board layers 24. Conductive signal paths formed within the PC board layers 24 also are formed of copper or another effective heat conductor. Accordingly, there also are heat transfer paths conducting the microprocessor heat toward other integrated circuits in the vicinity of the microprocessor. This is undesirable because these other integrated circuits typically are not as tolerant of increased operating temperatures as the microprocessor, and/or do not have heat sinks in proximate thermal communication.

Heat Dissipation Structure Embodiments

Figure 4:
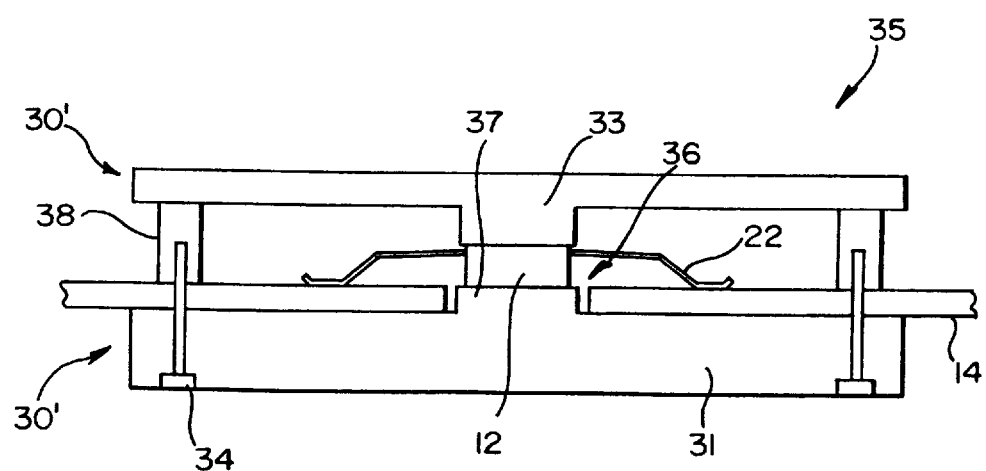
FIG. 4 is a cross-sectional view of a PC board, integrated circuit and two-piece heat sink configured to implement a heat transfer method between the integrated circuit and heat sink according to an embodiment of the invention.

FIG. 4 shows a heat dissipation structure 35 for transferring heat away from a high speed microprocessor integrated circuit 12 according to one embodiment of the invention. A heat sink 30' having two sections 31, 33 sandwiches the microprocessor 12 to transfer heat away from the microprocessor 12. A lower section 31 is in thermal contact with a lower surface of the microprocessor, while an upper section 33 is in thermal contact with an upper surface of the microprocessor. The PC board 14 for the microprocessor 12 has an opening 36 into which a portion 37 of a heat sink section 31 extends. The heat sink portion 37 fills the opening 36. The microprocessor 12 is mounted to the lower heat sink section 31 via thermal mounting tape. The heat sink upper section 33 includes legs 38. The upper section 33 is fastened to the heat sink lower section 31 via mounting screws 34 extending through the PC board 14 into the legs 38.

To assemble the structure 35, the microprocessor 12 is mounted to the PC board 14 via a polyamide structure with leads 22. Next, thermal mounting tape is applied and the lower section 31 of the heat sink 30' is inserted into contact with the microprocessor 12 via the contact tape. Lastly, the upper section 33 is applied and fastened to the lower section 33.

FIGS. 5 and 6 show a heat dissipation configuration 40 for conducting heat away from an integrated circuit ("IC") 42 in another embodiment of this invention. The IC 42 is a microprocessor or other heat generating IC. Shown is an IC 42 having protruding tape automated bonding ("TAB") contacts 44. ICs having other lead configurations or special package enclosures also are encompassed by the heat dissipation scheme of this invention. A polyamide structure 18 maps contact connections between the microprocessor 42 and PC board traces. The polyamide structure 18 includes inner leads 20 compression mounted to the microprocessor contacts 44 and outer leads 22 soldered to the PC board traces. The polyamide structure 18 has internal circuit paths which are mapped to provide desired path connections between a given inner lead 20 (and thus a desired microprocessor contact 44) and a given outer lead 22 (and thus a desired PC board trace). An encapsulant 45 is applied to the microprocessor 12 at a surface adjacent to the polyamide structure 18.

The IC 42 is mounted at its undersurface 82 to a heat conductive substrate 50 via thermal mounting tape 65. In a preferred embodiment the substrate 50 is made of copper or silver. The substrate 50 is mounted to a multi-layer printed circuit ("PC") board 52. The PC board includes an upper layer 54, a bottom layer 56 and one or more intermediary layers 58. Typically each layer 54–58 is an electrically insulative layer with various electrically-conductive signal paths formed therein. The PC board 52 defines an opening 60 extending all the way through the board. The substrate 50 is mounted or otherwise attached to the PC board 52 to extend into the opening 60. In a preferred embodiment the substrate 50 defines a lip portion 62 along its periphery. The lip portion 62 extends around the perimeter of the substrate 50. The substrate 50 has an upper surface 64, an under surface 66, and a side perimeter 68. To install the substrate 50 the substrate upper surface 64 is inserted at the undersurface 70 of the PC board 52 through the opening 60. The substrate upper surface 64 extends to be flush with an upper surface 72 of the PC board. As shown in FIG. 5, solder 74 is located at the PC board 52 under surface 70 along the periphery of the opening 60. The substrate lip 62 is pressed to the solder 74. The substrate 50 then is heated to a temperature that liquifies the solder 74. The solder 74 then cools while the lip 62 is held to the PC board 52. This permanently affixes the substrate 50 within the PC board opening 60. Other mounting methods are used in alternative embodiments. For example an adhesive having low heat conductivity is used in an alternative embodiment.

In an exemplary embodiment for a 46 mil thick PC board 52, the substrate 50 is 60 mils thick. The lip 62 extends a thickness of 20 mils, while the remainder of each sidewall extends another 40 mils. The opening 60 has a square shape extending 1.27 cm along each length. The substrate 50 correspondingly has a square shape. The portion of the substrate fitting within the opening extends approximately 1.25 cm along each length. The portion of the substrate beneath the opening 60 extends wider at approximately 1.4 cm along each length.

According to the preferred embodiment the substrate 50 is only in direct physical contact with the undersurface 70 of the PC board 52. As shown in FIG. 6 there is an air gap between the substrate 50 and the walls of the opening 60. In one embodiment the air gap extends for 10 mils. Thus, the substrate 50 is not in physical contact with any layers 54, 58 of the PC board 52 other than the underlayer 56.

Figure 7:
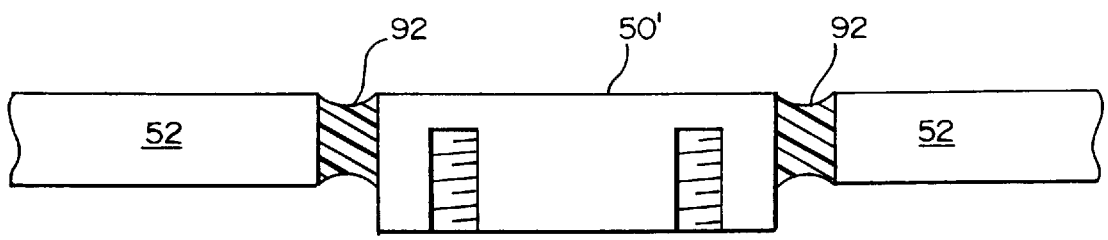
FIG. 7 is a partial cross-sectional view showing an alternative heat conductive wafer embodiment bonded to a PC board.

FIG. 7 shows an alternative embodiment for a heat conductive substrate 50'. Such substrate 50' omits the lip portion 62 of substrate 50. The alternative substrate 50' is held to the PC board 52 via thermal insulating bonding material 92 along its sides 68. Thus, the bonding material 92 is located within the opening 60 filling all or a portion of the air gap 80. Such mounting method also serves as an alternative and/or an additional mounting method for the substrate 50 of FIGS. 5 and 6. An exemplary material 92 is a polyurethane elastomer, such as RP 6403-1 resin and hardener (REN:C:O-THANE™) from Ciba-Geigy Corporation's Formulated Materials Group in East Lansing, Mich.

Figure 8:
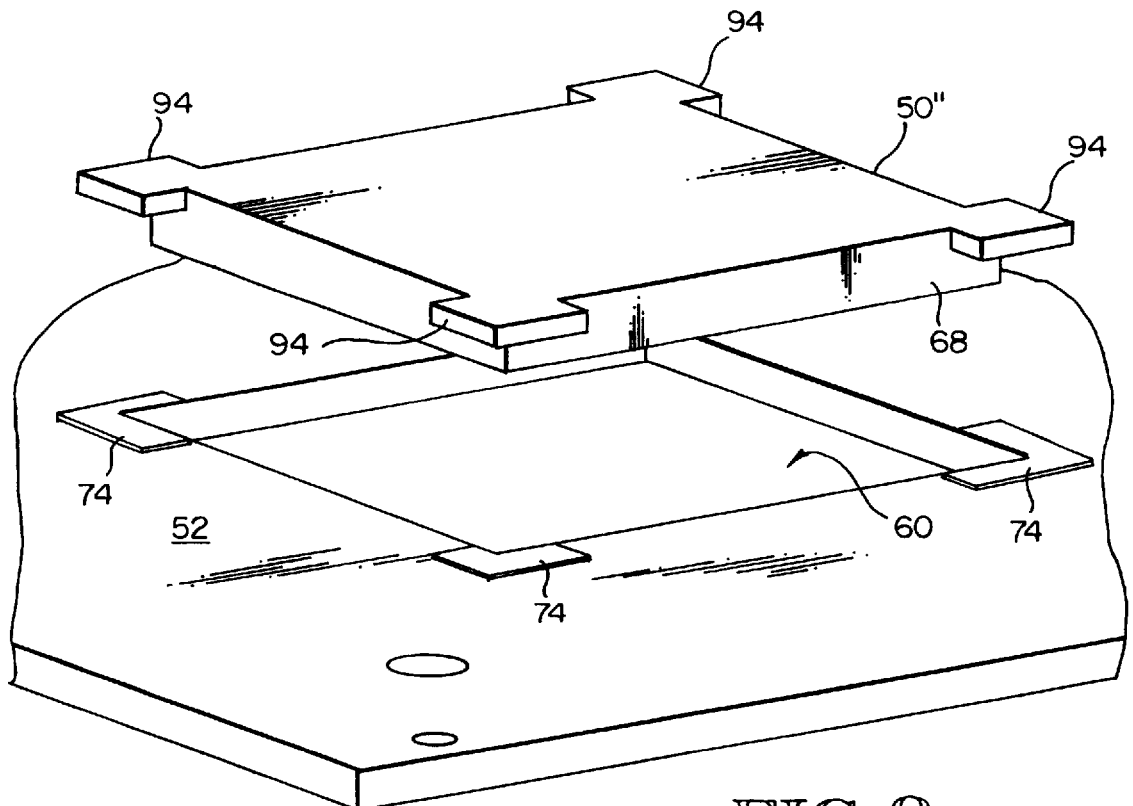
FIG. 8 is a perspective view of another alternative heat conductive wafer embodiment.

FIG. 8 shows another alternative embodiment for a heat conductive substrate 50". Such substrate 50" includes mounting tabs 94 at each corner in place of the lip 62 of substrate 50. The substrate 50" is mounted in a similar manner as the substrate 50 or 50' using a solder mounting method or a adhesive bonding method. For the soldering method solder 74 is located at each corner of the opening 60 in alignment with the mounting tabs 94. The substrate 50" is heated while in contact with the solder, liquefying the solder and causing the substrate 50" to attach to the PC board at the mounting tabs 94.

According to a preferred embodiment the IC 42 is mounted using thermal mounting tape 65 so as to provide co-planar intimate thermal contact between the IC 42 and substrate 50 via the adhesive material. Alternatively, the IC 42 is mounted to the substrate 50 using conventional surface mounting or other techniques. The substrate 50 has an upper surface 64 area which is at least as large as the surface area of an undersurface 82 of the IC 42. Preferably, the substrate upper surface 64 area is greater than that of the IC undersurface 82. The larger area is preferable for maximizing heat conductivity away from the IC 42.

In one embodiment a heat sink 90 is mounted to the substrate 50,/50'/50". The substrate has threaded openings for receiving screws 96 which hold the heat sink to the substrate. The heat sink 90 extends over a larger area than the substrate. In some embodiments the heat sink 90 also is held to the undersurface 70 of the PC board 52. As a result much of heat conducted through the substrate 50 to the undersurface 70 is absorbed by the heat sink 90 instead of travelling to other ICs in the vicinity of IC 42. In an alternative embodiment, the heat sink is mounted to the PC board 52 and held in physical contact with the substrate 50.

Meritorious and Advantageous Effects

The substrate 50/50'/50" serves as an effective heat transfer path for conducting heat away from the IC 42 to a heat sink 90. Because the IC 42 is mounted to the substrate there is no direct heat conduction from the IC 42 into the PC board 52. Because the substrate does not make physical contact with the sidewalls of the PC board opening 60, there is little heat conduction into the PC board 52 via the substrate. Because the heat sink 90 is held in thermal contact with the undersurface 70 of the PC board, the only part of the PC board receiving heat via conduction from the substrate is in thermal contact with the heat sink 90. By mounting the IC 42 to the substrate, one conventional heat transfer path from IC to PC board is eliminated. By defining an air gap 80 between the substrate 50 and the PC board 52 layers 54, 58 other potential heat transfer paths are avoided.

One advantage of the invention is that heat conductivity between a given integrated circuit, such as a high speed microprocessor, and neighboring circuits is reduced. Another advantage is that an effective heat transfer path is established between a given integrated circuit and a heat sink. Another advantage is that an effective thermal contact is established between a given integrated circuit and the substrate. Another advantage is that only an awkward thermal transfer path occurs between the heat transfer substrate and the PC board.

Another advantage of the invention is that the substrate 50/50'/50" can be mounted directly to the PCB by a simple soldering (e.g., substrate 50/50") or bonding (substrate 50/50'/50") process. In comparison to the screwed on heat structure of FIG. 4, the soldering and bonding processes prevent movement relative to the PC board. This protects the inner and outer leads 20, 22 of the polyamide structure 18 from undergoing motion stress. Additional fasteners to hold the IC in place are not needed.

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. An apparatus for conducting heat away from an integrated circuit, the integrated circuit defining a underlying surface area and an overlying surface area, the apparatus comprising:

a PC board defining a through-opening over a thickness of the PC board, the PC board having a first surface and a second surface;

a heat conductive substrate, a first portion of which is mounted within the through-opening, a second portion of which is mounted with a quantity of solder to the first surface of the PC board adjacent to the through-opening to define a contact area extending outward from the through-opening for a first length, said first length being less than the PC board thickness to minimize thermal communication between the heat conductive substrate and the PC board, the heat conductive substrate having a first surface with an area at least as large as the integrated circuit underlying area, wherein the first surface of the heat conductive substrate is co-planar with the second surface of the PC board;

a first heat sink removably mounted into thermal contact with the substrate;

a second heat sink having a plurality of legs, the second heat sink positioned on an opposing side of the PC board than the first heat sink and the second heat sink mounted to the overlying surface area of the integrated circuit;

a plurality of mounting screws, the first heat sink attached to the second heat sink with the plurality of mounting screws extending through the PC board into the plurality of legs of the second heat sink; and wherein the integrated circuit is fixed into thermal contact with the heat conductive substrate first surface at the integrated circuit's underlying surface area.

2. The apparatus of claim 1, in which the PC board comprises a top surface, a bottom surface and an intermediary layer, and in which the substrate is concentrically spaced apart from the PC board intermediary layer.

3. The apparatus of claim 1, in which the contact area occurs along the entire perimeter of the through-opening.

4. An apparatus for conducting heat away from an integrated circuit, the integrated circuit having an underlying surface area and an overlying surface area, the apparatus comprising:

a PC board defining a through-opening of a first area;

a heat conductive substrate, a portion of which is positioned within the through-opening, the heat conducting substrate having a first surface with an area less than the first area and at least as large as the integrated circuit underlying area, wherein the integrated circuit is fixed into thermal contact with the heat conductive substrate first surface at the underlying surface area, and wherein the heat conductive substrate has a second surface opposite the first surface with an area less than the first area, wherein the substrate is spaced apart from the PC board by a thermally insulating adhesive.

5. The apparatus of claim 4, further comprising a first heat sink removably mounted to the substrate.

6. The apparatus of claim 5, in which the first heat sink is removably mounted into thermal contact with the substrate without forming direct thermal contact between the heat sink and the PC board.

7. The apparatus of claim 6, further comprising a second heat sink positioned on an opposing side of the PC board than the first heat sink, the second heat sink mounted to the overlying surface area of the integrated circuit and attached to the first heat sink.

* * * * *